United States Patent
Guo et al.

(10) Patent No.: US 9,853,418 B2
(45) Date of Patent: Dec. 26, 2017

(54) TUNABLE LASER AND TUNING METHOD USING THE SAME

(71) Applicants: HUAZHONG UNIVERSITY OF SCIENCE AND TECHNOLOGY, Wuhan (CN); Weihua Guo, Wuhan (CN)

(72) Inventors: Weihua Guo, Wuhan (CN); Quanan Chen, Wuhan (CN); Qiaoyin Lu, Wuhan (CN)

(73) Assignees: HUAZHONG UNIVERSITY OF SCIENCE AND TECHNOLOGY, Wuhan (CN); Weihua Guo, Wuhan (CN)

( * ) Notice: Subject to any disclaimer, the term of this patent is extended or adjusted under 35 U.S.C. 154(b) by 0 days.

(21) Appl. No.: 15/439,907

(22) Filed: Feb. 22, 2017

(65) Prior Publication Data
US 2017/0163008 A1 Jun. 8, 2017

Related U.S. Application Data

(63) Continuation-in-part of application No. PCT/CN2015/082342, filed on Jun. 25, 2015.

(30) Foreign Application Priority Data

Nov. 27, 2014 (CN) .......................... 2014 1 0704739

(51) Int. Cl.
*H01S 5/065* (2006.01)
*H01S 5/10* (2006.01)
*H01S 5/068* (2006.01)

(52) U.S. Cl.
CPC ........ *H01S 5/0653* (2013.01); *H01S 5/06821* (2013.01); *H01S 5/1028* (2013.01)

(58) Field of Classification Search
CPC ... H01S 5/0653; H01S 5/1028; H01S 5/06821
USPC ...................................... 372/18, 23
See application file for complete search history.

(56) References Cited

U.S. PATENT DOCUMENTS

| | | | | |
|---|---|---|---|---|
| 5,457,760 A | * | 10/1995 | Mizrahi | G02B 6/29319 385/14 |
| 6,614,951 B2 | * | 9/2003 | Lin | G02B 6/12014 385/15 |
| 2006/0050747 A1 | * | 3/2006 | Trutna, Jr. | H01S 5/141 372/20 |

* cited by examiner

*Primary Examiner* — Tuan Nguyen
(74) *Attorney, Agent, or Firm* — Matthias Scholl, PC; Matthias Scholl (57) ABSTRACT

A tunable laser, including: a gain section configured to provide an optical gain for lasing; a multi-channel splitter section configured to split an input signal into multiple outputs; and a multi-channel reflection section, the multi-channel reflection section including multiple arms of unequal lengths and configured to provide an optical feedback and a mode selection function for the laser to work. The gain section, the multi-channel splitter section, and the multi-channel reflection section are sequentially connected in that order. The facet of the gain section away from the multi-channel splitter section is an optical output facet of the laser. When arranging the multiple arms of the multi-channel reflection section in an order according to their lengths, length difference between adjacent arms are unequal. Facets of the multiple arms away from the multi-channel splitter section are coated with reflection films.

18 Claims, 9 Drawing Sheets

TUNABLE LASER AND TUNING METHOD USING THE SAME

CROSS-REFERENCE TO RELATED APPLICATIONS

This application is a continuation-in-part of International Patent Application No. PCT/CN2015/082342 with an international filing date of Jun. 25, 2015, designating the United States, now pending, and further claims foreign priority benefits to Chinese Patent Application No. 201410704739.0 filed Nov. 27, 2014. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND OF THE INVENTION

Field of the Invention

The invention relates to a tunable laser and a tuning method using the same.

Description of the Related Art

Figure 1:
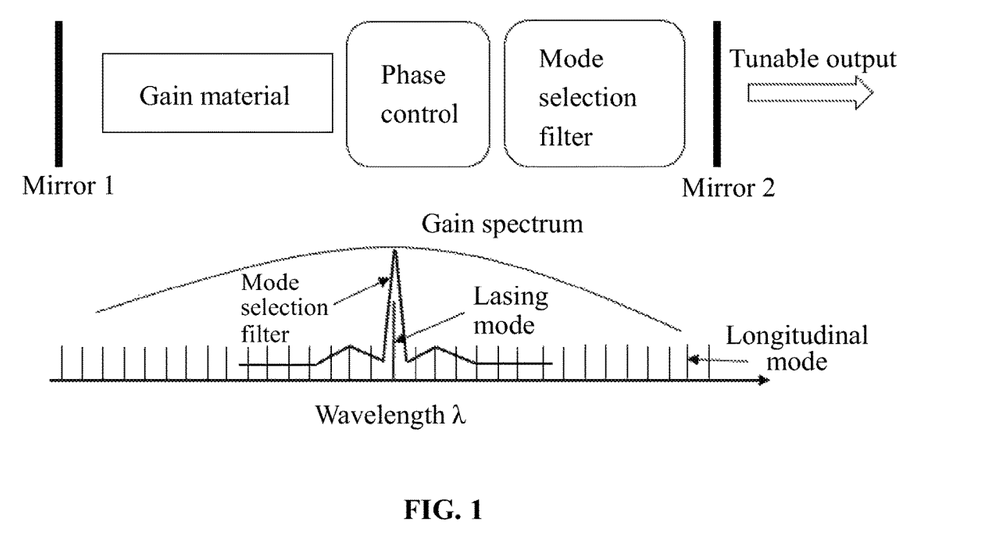
FIG. 1 is a schematic drawing of the tuning principle of tunable semiconductor lasers.
Figure 2:
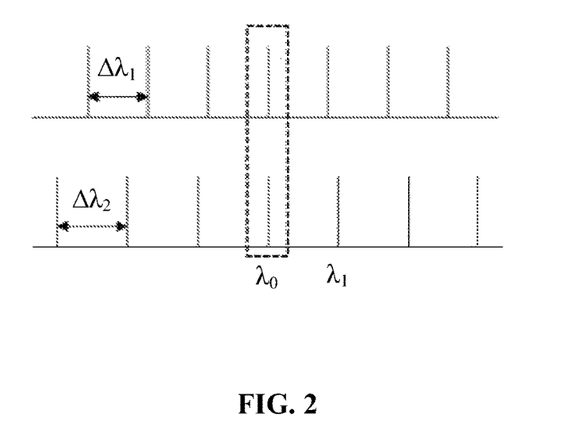
FIG. 2 is a schematic drawing of Vernier effect ($\lambda_0$)
Figure 3:
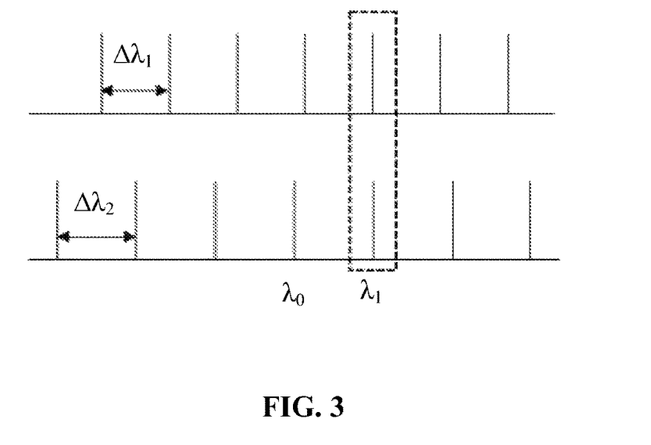
FIG. 3 is a schematic drawing of Vernier effect ($\lambda_1$)

A typical Distributed Bragg Reflector (DBR) tunable laser, as shown in FIG. 1, includes: a gain section, a phase section, and a grating section. The largest tuning range of the wavelength of the DBR tunable laser is approximately 22 nm. To enlarge the tuning range, Vernier effect can be adopted, as shown in FIGS. 2 and 3, in which, two different grating structures are utilized to generate two multi-peak comb-like reflection spectra with different wavelength spacings, and currents are injected into the two different grating structures. However, the fabrication of the grating structures requires both complex regrowth steps and high-resolution processing like electron-beam lithography, which increases the difficulty and the production cost in the fabrication of the laser.

SUMMARY OF THE INVENTION

In view of the above-described problems, it is one objective of the invention to provide a tunable laser and a tuning method using the same. The laser of the invention has wide tuning range and good performance The fabrication of the laser is easy to practice and the production cost of the laser is low.

To achieve the above objective, in accordance with one embodiment of the invention, there is provided a tunable laser. The tunable laser comprises: a gain section; a multi-channel splitter section; and a multi-channel reflection section, the multi-channel reflection section comprising multiple arms of unequal lengths. The gain section, the multi-channel splitter section, and the multi-channel reflection section are sequentially connected in that order. The gain section is configured to provide an optical gain for lasing. A facet of the gain section away from the multi-channel splitter section is an optical output facet of the laser. The multi-channel splitter section is configured to split an input signal into multiple outputs. The multi-channel reflection section is configured to provide an optical feedback and a mode selection function for the laser to work. When arranging the multiple arms of the multi-channel reflection section in an order according to their lengths, length difference between adjacent arms are unequal. Facets of the multiple arms away from the multi-channel splitter section are coated with reflection films. Arm phase sections are disposed on each of the multiple arms of unequal lengths for adjusting phases of the arms individually. A number of the multiple arms is equal to or greater than 3.

In a class of this embodiment, the laser further comprises a common phase section. The common phase section is configured to change a wavelength of a longitudinal mode of the laser and is connected between the gain section and the multi-channel splitter section.

In a class of this embodiment, the multi-channel splitter section adopts multi-mode interferometers (MMI), Y branches, or a star coupler.

In a class of this embodiment, a reflection spectrum dominated by a single main reflection peak is generated by aggregated reflections from the multi-channel reflection section to achieve single mode working.

In a class of this embodiment, in use, the length difference between adjacent arms are determined as follows: adjusting the length difference $\Delta L_i$ between adjacent arms according to that when an average value of the length difference $\Delta L_i$ tends to enlarge, a full width half maximum (FWHM) of the main reflection peak reduces thus suppression of the adjacent longitudinal modes is enhanced, while suppression of the other minor random reflection peaks is weakened, and that when the average value of the length difference $\Delta L_i$ tends to reduce, suppression of the other minor random reflection peaks is enhanced, while the full width half maximum of the main reflection peak enlarges thus weakening suppression of the adjacent longitudinal modes; and optimizing the length difference between adjacent arms so as to suppress both the adjacent longitudinal modes and the other minor random reflection peaks to an appropriate level.

In a class of this embodiment, the lengths of the multiple arms are determined as follows: choosing one arm as a reference arm and setting an appropriate length for the reference arm; and setting lengths of other arms according to the length difference.

In accordance with another embodiment of the invention, there is provided a tuning method using the laser. The tuning method comprises coarse tuning of a working wavelength of the laser, the coarse tuning comprising: choosing one arm as the reference arm; and adjusting phases of other arms and enabling the phases of the other arms to be the same as a phase of the reference arm at a selected wavelength to locate the main reflection peak of the reflection spectrum at the selected wavelength and allow the laser to work in the vicinity of the selected wavelength.

In a class of this embodiment, the method further comprises fine tuning of the working wavelength of the laser, the fine tuning comprising: adjusting the phase of the reference arm; and readjusting the phases of other arms and enabling the phases of the other arms to be the same as the phase of the reference arm at the same selected wavelength to maintain a position of the main reflection peak of the reflection spectrum and align a position of the longitudinal mode position with the main reflection peak and to allow the laser to work at the wavelength selected.

In a class of this embodiment, the method further comprises: adjusting a phase of the common phase section to align the position of the longitudinal mode with the reflection peak at the selected wavelength to achieve the fine tuning of working wavelength of the laser.

In a class of this embodiment, adjustments of phases of the arm phase sections and the phase of the common phase section are fulfilled by injecting currents into corresponding phase sections.

Advantages of the tunable laser and the tuning method using the same according to embodiments of the invention are summarized as follows:

1. The laser of the invention does not use gratings to achieve mode selection. Moreover, when using arm phase sections, the laser is insensitive to the initial phases of the arms, which reduces the demands on high precision fabrication. Therefore, the fabrication of the laser only needs standard photolithography, thus potentially lowers the cost.

2. The reflection spectrum of the device is generated by the addition of the reflections from the multiple arms, so the loss of each arm suffered from current injection into the arm phase section is independent from each other. Moreover, currents injected into each arm are not always the highest. Therefore, when compared with using gratings, using the multi-channel reflection section of the laser of the invention to achieve mode selection has less influence from the losses induced by current injection into the arm phase sections for wavelength tuning.

3. When tuning wavelength of the present tunable laser, the phase change of each arm only needs to be adjusted to it at most. Moreover, the lengths of the arm phase sections can be made relatively long, which reduces the requirement on the capability of the phase sections for phase shift generations. Besides, using relatively long arm phase sections is able to reduce current density in the arm phase sections so as to reduce thermal effect due to current injection, which is beneficial to improve the speed of wavelength tuning.

4. The mode section filter of the present invention is on the same side of the gain section and the light outputs from the other side of the gain section, so the output light does not suffer from free carrier absorption caused by current injection, which makes the output light power keep stable across a large range of wavelength. Stable output power of the laser reduces the difficulty to control in the end.

BRIEF DESCRIPTION OF THE DRAWINGS

The invention is described hereinbelow with reference to the accompanying drawings, in which.

In the drawings, the following reference numbers are used: 1. Gain section; 2. Common phase section; 3. Multi-channel splitter section; 4. Multi-channel reflection section; 5. Arm phase section; 6. High-reflection coating film; 7. Output facet of the laser; 8. 1×2 MMI; 9. S bends; 10. Electrode contact layer; 11. Cladding layer; 12. Upper optical confinement layer; 13. Active layer; 14. Lower optical confinement layer; 15. Optical waveguide layer; and 16. Electrode.

DETAILED DESCRIPTION OF THE EMBODIMENTS

For further illustrating the invention, examples detailing a tunable laser and a tuning method using the same are described below. It should be noted that the following examples are intended to describe and not to limit the invention.

Figure 4:
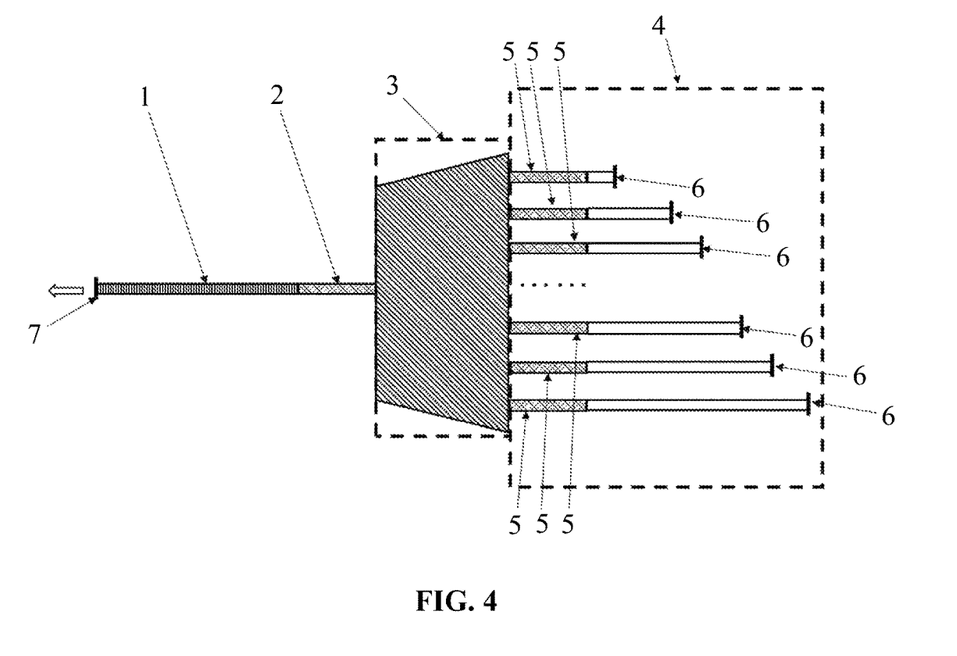
FIG. 4 is a schematic drawing of the MCI laser.

FIG. 4 is a schematic drawing of an MCI laser. The MCI laser comprises four sections: a gain section 1, a common phase section 2, a multi-channel splitter section 3, and a multi-channel reflection section 4. The common phase section 2 is between the gain section 1 and the multi-channel splitter section 3. The multi-channel splitter section 3 is between the common phase section 2 and the multi-channel reflection section 4. The gain section 1 is used to provide optical gain for lasing. The common phase section 2 is used to shift the cavity longitudinal mode. The multi-channel splitter section 3 is optionally realized by multimode interferometers (MMI), Y-branches, star coupler. The multi-channel splitter section 3 is used to split the input optical field into multiple outputs. The multi-channel reflection section 4 is composed of multiple arms with unequal lengths and there is an independent arm phase section 5 on each arm. Besides, the ends of the multiple arms are coated with reflection films 6. The arm phase sections are used to adjust the phases of each arm. The multi-channel reflection section 4 is used to achieve mode selection and provide optical feedback for the laser to work. The optical output facet 7 of the MCI laser is a facet of the gain section 1 away from the multi-channel splitter section.

The working principle of the MCI laser of the invention is as follows:

A complex reflection coefficient calculated at a right side of the gain section is $$r_2(\lambda) = \frac{1}{N}\sum_{i=1}^{N} r_3 e^{-2j\beta L_p} e^{-2j\beta L_m} e^{-2j\beta L_i} \quad (1)$$

where N is a number of the channels, $\lambda$ represents a wavelength, j is an imaginary unit, $r_3$ is a reflection coefficient of the rear facets of the N arms (assuming that the N HR-coated facets have the same reflection coefficients), $L_p$ is a length of the common phase section, $L_m$ is a propagation length in the multi-channel splitter section, $L_i$ (i=1,2,3 ... N) is a length of the i-th arm, $\tilde{\beta}$ is a complex propagation constant of a guided mode.

$$\tilde{\beta}=\beta-\tfrac{1}{2}j\alpha \qquad (2)$$

where $\alpha$ is an intrinsic loss of passive waveguides, $\beta$ is a propagation constant of the guided mode. For simplicity, it is assumed in equation (1) that the multi-channel splitter section splits the optical field into N equal fields, which is not necessary in reality and is decided by the components used to achieve the multi-channel splitter section. In order to attain a narrow strong reflection peak at the desired wavelength $\lambda_0$, the round trip phases from the start of the common phase section to the end of each arm should be the same at wavelength $\lambda_0$, which means that the phase difference between any two arms should be integral multiples of $2\pi$. So the reflections of the N arms can achieve constructive interference at wavelength $\lambda_0$, which generates a narrow strong reflection peak at wavelength $\lambda_0$.

Although making the N arms in phase can generate a narrow strong reflection peak at $\lambda_0$, the shape of the whole reflection spectrum, especially the suppression of the other relatively weak reflection peaks, is decided by the N-1 length difference of the N arms. Supposing that the lengths of the N arms are arranged increasingly, the length increase $\Delta L_i$ between the i-th and (i+1)-th arm is $$\Delta L_i = L_{i+1} - L_i, \; i=1,2,3 \ldots N-1 \qquad (3)$$

So equation (1) is expressed by $\Delta L_i$ as below:

$$r_2(\lambda) = \frac{1}{N} r_3 e^{-2j\tilde{\beta}(L_p + L_m + L_1)} \left( 1 + \sum_{i=1}^{N-1} e^{-2j\tilde{\beta}\sum_{k=1}^{i}\Delta L_k} \right) \qquad (4)$$

Figure 5:
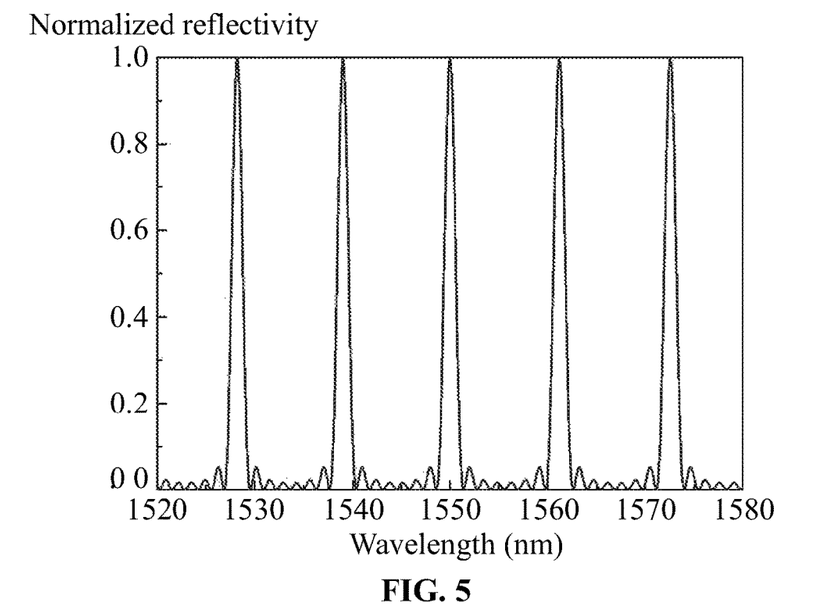
FIG. 5 illustrates reflection spectrum of eight arms with equal arm length difference (30 μm)
Figure 6:
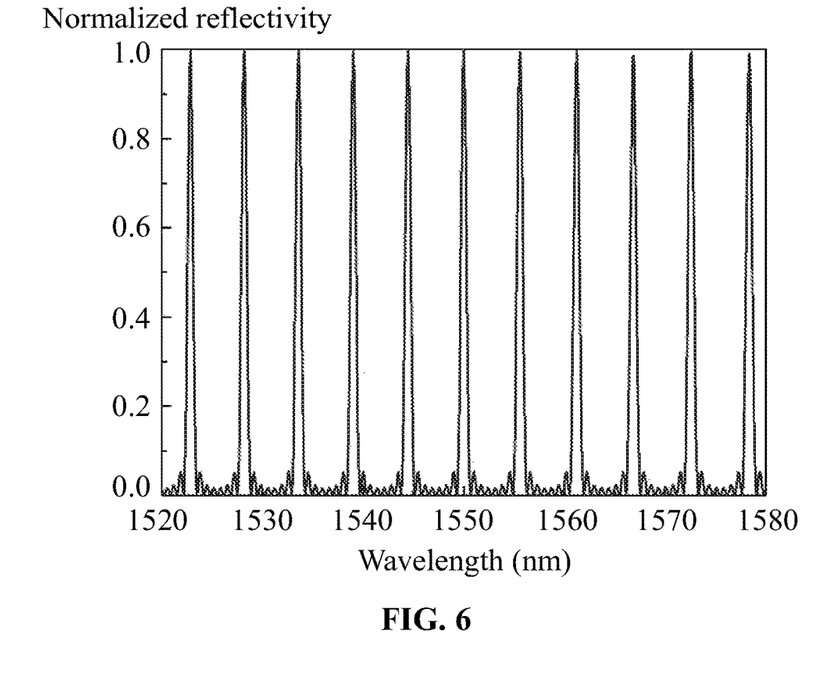
FIG. 6 illustrates reflection spectrum of eight arms with equal arm length difference (60 μm)
Figure 7:
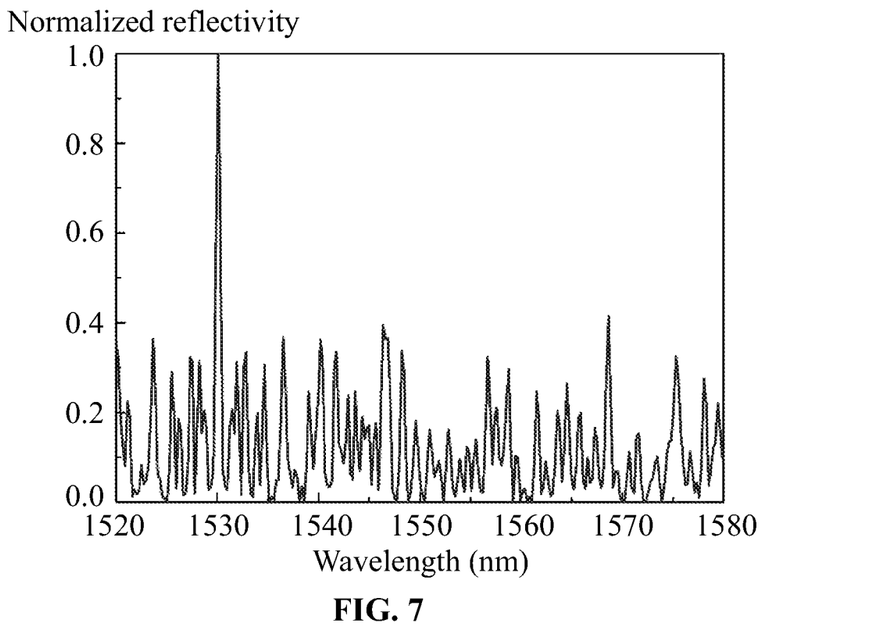
FIG. 7 illustrates reflection spectrum of eight arms with unequal arm length difference and average length difference is 72.36 μm.
Figure 8:
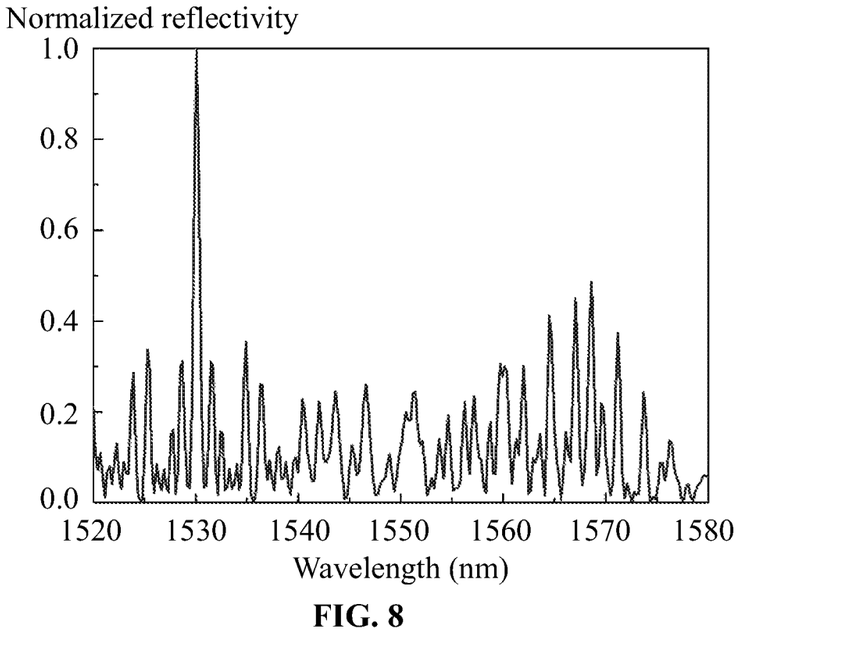
FIG. 8 illustrates reflection spectrum of eight arms with unequal arm length difference and average length difference is 60.20 μm.

As shown in equation (4), the common phase section, the N-channel splitter section and the length of the first arm can be treated as a part of the resonant cavity, which is reflected in the common phase tem $e^{-2j\tilde{\beta}(L_p + L_m + L_1)}$, while the whole shape of the reflection spectrum is determined by the N-1 length difference $\Delta L_i$, i=1,2,3 ... N-1. Therefore, the whole shape of the reflection spectrum is optimized by optimizing the N-1 length difference. The simplest case is that $\Delta L_i$ equals to each other, which makes the N channels generate a comb-like reflection spectrum. The FWHM (Full width high maximum) and FSR (Free spectral range) of the comb-like reflection spectrum are related to the length difference. FIGS. 5 and 6 show the reflection spectrum for a case of eight channels with two different length difference. As shown in FIGS. 5 and 6, the larger the length increase, the narrower the reflection peaks and the smaller the FSR. In the MCI laser case, instead of a comb-like reflection spectrum, a reflection spectrum dominated by a single narrow main peak is needed to ensure good single mode working. If the arm length difference is unequal, the periodicity of the reflection spectrum will be broken, which makes the reflection spectrum have a lot of random reflection peaks. As mentioned above, making the N channels in phase at wavelength $\lambda_0$ can generate a narrow main reflection peak at wavelength $\lambda_0$. FIGS. 7 and 8 show a case of eight channels with two groups of unequal length difference. As shown in FIGS. 7 and 8, a lot of random reflection peaks are presented but only one narrow main reflection peak at 1530 nm where the phases of the N channels are the same. Only making the length difference unequal is not enough, because the FWHM of the main reflection peak should be small enough to suppress the adjacent cavity longitudinal modes and the other random reflection peaks should also be suppressed well to leave the main reflection peak the strongest so that the MCI laser has good single mode working performance. Therefore, the N-1 length difference should be carefully optimized. During the process of optimization, as shown in FIG. 7, it is found that if the arm length difference is averagely larger, the main reflection peak that is expected to be the strongest will be potentially narrower, which will be beneficial to suppress adjacent longitudinal modes; however, the other random reflection peaks will be more difficult to suppress. On the opposite, as shown in FIG. 8 if the arm length difference is averagely smaller, it helps to suppress the other reflection peaks but the FWHM of the main reflection peak will be potentially larger. So practically a trade-off by adjusting the average arm length difference is required.

After attaining an ideal reflection spectrum through optimizing the arm length difference, the lengths of the N arms are certain. The length differences between the other N-1 arms and the first arm which is selected to be the reference arm, can be calculated by the length difference.

$$L_{i+1} - L_1 = \Delta L_1 + \Delta L_2 + \ldots + \Delta L_i, \; i=1,2,3 \ldots N-1 \qquad (5)$$

Correspondingly the initial round trip phase differences can be written as $$\Delta \Phi_i(\lambda) = 2\beta(L_{i+1} - L_1) = 2m_i(\lambda)\pi + \phi_0^i(\lambda) \; i=1,2,3 \ldots N-1 \qquad (6)$$

As already mentioned, to attain a narrow main reflection peak at wavelength $\lambda_0$, the N channels should be in phase at wavelength $\lambda_0$. In reality, there are always phase errors expressed by $\phi_0^i(\lambda_0)$ in equation (6), which makes the No. 2 to N channels out-of-phase with that of the first channel. Thus an independent arm phase section is included on each arm to adjust the phases of the No. 2 to N channels. By injecting currents into these arm phase sections, these phase errors can be eliminated so that the N channels can be in phase. Thus a narrow main reflection peak at wavelength $\lambda_0$ is attained, which makes the longitudinal mode around $\lambda_0$ lase. To make the longitudinal mode around $\lambda_1$ lase, the phases of the No. 2 to N channels are required to be readjusted to make them in phase with the first channel at wavelength $\lambda_1$. Therefore, the center wavelength of the main reflection peak moves from wavelength $\lambda_0$ to wavelength $\lambda_1$, which tunes the lasing wavelength from the longitudinal mode around $\lambda_0$ to the longitudinal mode around $\lambda_1$. For the MCI laser, the generation of the narrow main reflection peak and coarse tuning of the laser is achieved by adjusting the phases of the N-1 channels.

As mentioned above, the MCI laser of the invention uses multiple channels with unequal lengths to interfere with each other so as to generate a reflection spectrum dominated by a narrow reflection peak which therefore ensures the laser single mode working. Adjusting the phases of the N-1 arm phase sections can change the peak wavelength of the reflection spectrum so as to achieve coarse tuning of the MCI laser.

After coarse tuning, the position of the cavity longitudinal mode selected by the main reflection peak is adjusted so as to achieve fine tuning of the MCI laser.

Fine tuning of the MCI laser is realized in two ways: one way is to adjust the position of the selected longitudinal mode by adjusting the phase of the common phase section, which is similar to the fine tuning of the DBR type tunable lasers; another way is to control the total N arm phase sections at the same time. The second way is feasible because the first arm is actually a part of the resonant cavity. This means that if the first arm phase is now changed, the cavity longitudinal mode position can be adjusted, the same as adjusting the common phase section. The other N−1 channels have to be adjusted accordingly because they all have to be in phase with the first arm at the selected wavelength. So by adjusting the phases of the total N arms, both the cavity longitudinal mode position and the peak wavelength of the reflection spectrum are possibly adjusted. However, the second way of fine tuning causes the whole tuning strategy more complex because the fine tuning involves the adjustment of all N channels.

To demonstrate the feasibility of the MCI laser, the invention also presents design and simulation results of an eight-channel interference laser.

Figure 9:
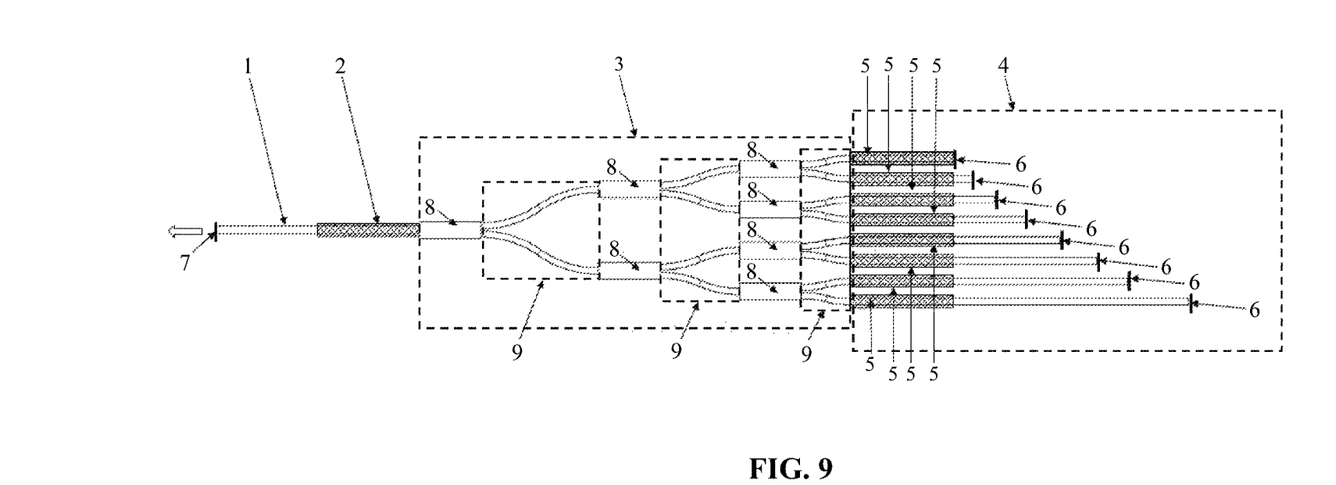
FIG. 9 is a schematic drawing of the eight-channel interference laser.
Figure 10:
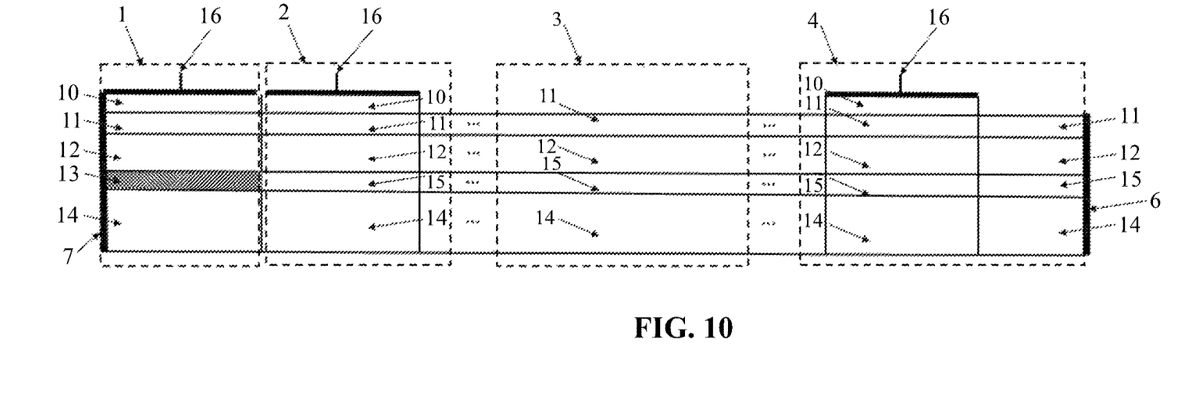
FIG. 10 is a longitudinal section drawing of the eight-channel interference laser.
Figure 11:
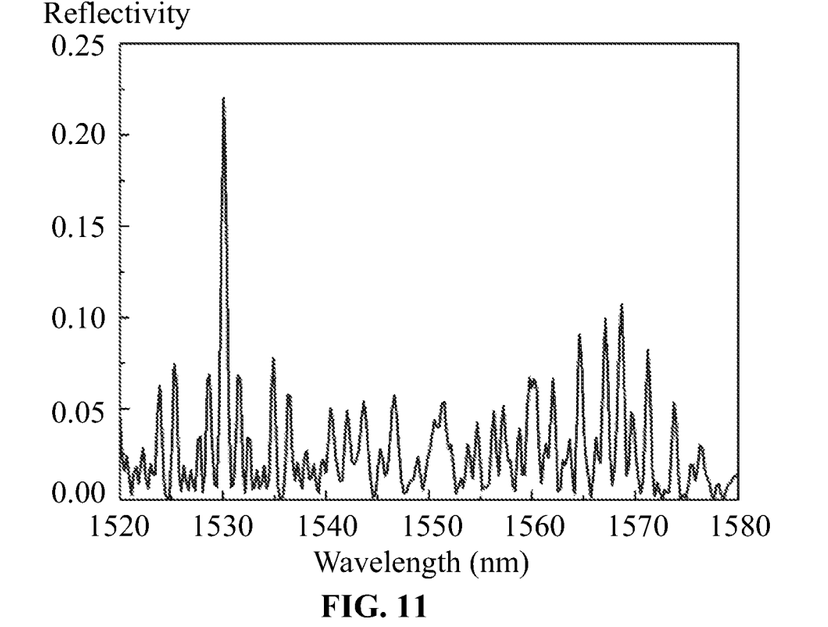
FIG. 11 illustrates reflection spectrum with center wavelength at 1530 nm.
Figure 12:
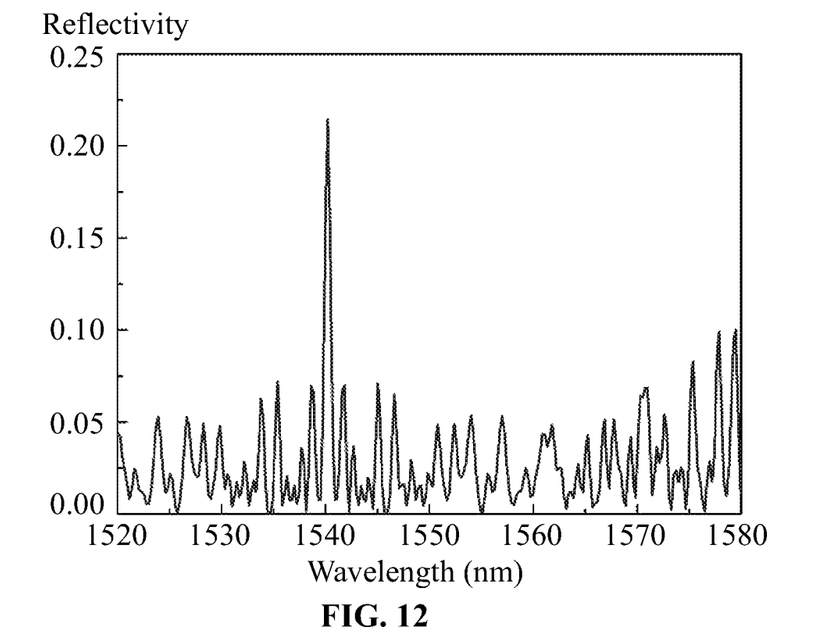
FIG. 12 illustrates reflection spectrum with center wavelength at 1540 nm.
Figure 13:
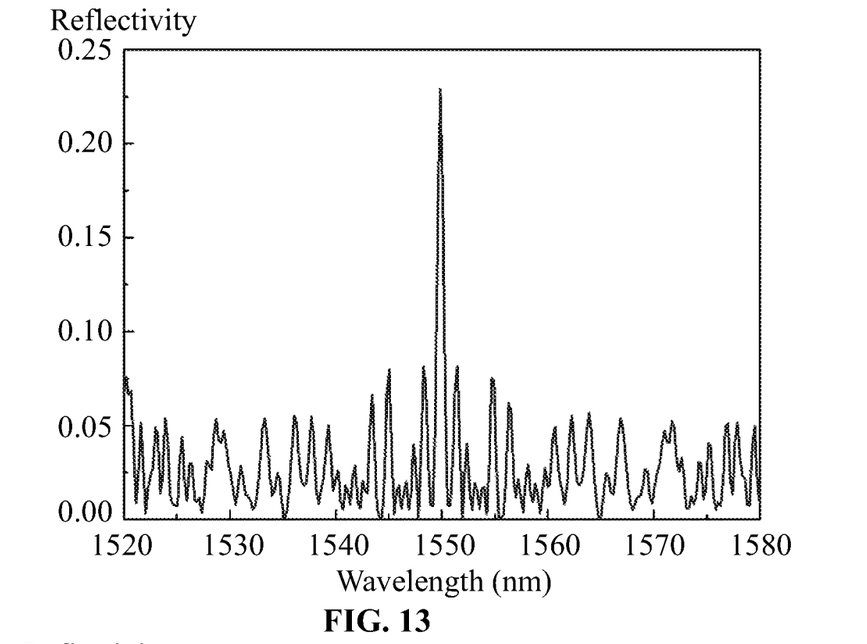
FIG. 13 illustrates reflection spectrum with center wavelength at 1550 nm.
Figure 14:
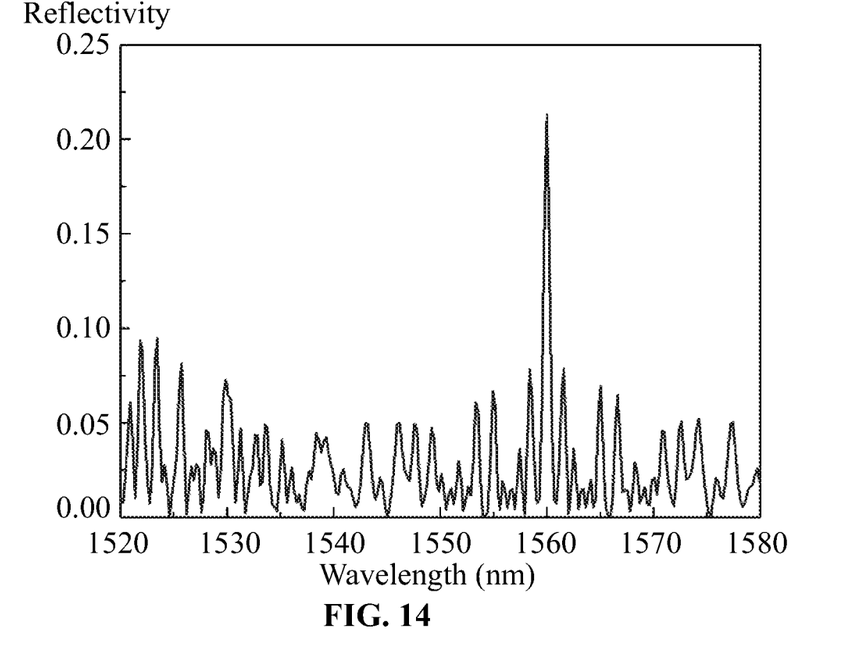
FIG. 14 illustrates reflection spectrum with center wavelength at 1560 nm.

FIG. 9 shows the schematic drawing of the eight-channel interference laser including four sections: a gain section 1, a common phase section 2, an eight-channel splitter section 3, and an eight-channel reflection section 4. The eight-channel splitter section 3 comprises seven 1×2 MMIs 8 (Multi-mode interferometer) and multiple S-bends 9. The eight-channel reflection section 4 contains eight arms with unequal length difference and an independent arm phase section 5 is disposed on each arm. In the passive section, the eight-channel interference laser uses deeply etched 2 um wide ridge waveguide structure. The gain section 1 is 400 μm long and the active region of gain section consists of five compressively strained InGaAsP quantum wells with the gain peak around 1550 nm. As shown in FIG. 10, the gain section 1 comprises: an electrode contact layer 10, a cladding layer 11, an upper optical confinement layer 12, an active layer 13, and a lower optical confinement layer 14, in that order, from the top to bottom. The common phase section 2 and all the arm phase sections 5 are 150 μm long and comprise an electrode contact layer 10, a cladding layer 11, an upper optical confinement layer 12, an optical waveguide layer 15, and a lower optical confinement layer 14, in that order, from the top to the bottom. 1×2 MMIs are 8 μm wide and 69 μm long and the radius of S-bends 9 is 100 μm. The eight-channel splitter section 3 and the non-phase section of each arm comprise a cladding layer 11, an upper optical confinement layer 12, an optical waveguide layer 15, and a lower optical confinement layer 14 from the top to bottom. The lengths of the eight arms are 100 μm, 109.94 μm, 253.91 μm, 299.13 μm, 318.08 μm, 350.99 μm, 376.56 μm, and 512.71 μm separately in ascending sequence. There are electrodes 16 on the gain section 1, the common phase section 2 and the eight arm phase sections 5. The reflectivity of the front cleaved facet 7 is 0.32 and the reflectivity of the eight HR-coated rear facets 6 is 0.81. Light outputs from the front cleaved facet 7.

TABLE 1

| Parameters used to simulate the eight-channel interference laser | |
|---|---|
| Active region volume V(μm³) | 26 |
| Active region length La (μm) | 400 |
| Waveguide width (μm) | 2 |
| MMI length Lmmi (μm) | 69 |
| S bend radius (μm) | 100 |
| S bend separation distance (μm) | 80, 40, 20 |
| Phase control section length (μm) | 150 |
| Front facet reflectivity | 0.32 |
| Rear facet reflectivity | 0.81 |
| Confinement factor (%) | 5 |
| Group index $n_g$ | 3.6 |
| Internal loss of active region (cm$^{-1}$) | 20 |
| Internal loss of passive section (cm$^{-1}$) | 5 |
| Linear recombination coefficient A (10⁸ s$^{-1}$) | 1 |
| Bimolecular radiation coefficient B (10⁸ cm³s$^{-1}$) | 1 |

TABLE 1-continued

| Parameters used to simulate the eight-channel interference laser | |
|---|---|
| Auger coefficient C (10⁸ cm⁶s$^{-1}$) | 3.5 |
| Spontaneous emission coefficient (10$^{-5}$) | 2.5 |
| Injection current I (mA) | 150 |
| Speed of light in vacuum (10⁸ m/s) | 3 |

Tuning the eight-channel interference laser is through adjusting the eight arm phase sections simultaneously. Through solving the multi-mode rate equations, lasing spectra, SMSRs, threshold currents and L-I curves of the eight-channel interference laser are obtained.

FIGS. 11-14 shows the reflection spectrum with different center wavelengths at 1530, 1540, 1550 and 1560 nm.

Figure 15:
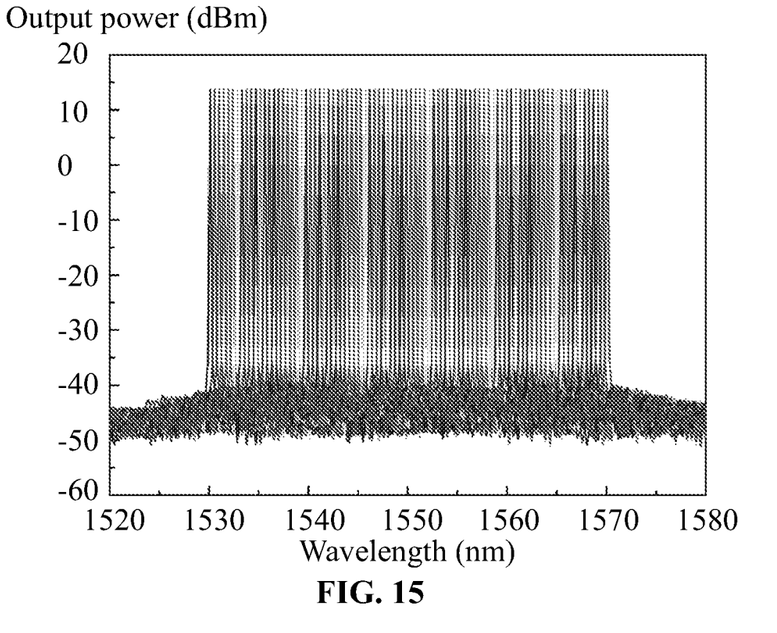
FIG. 15 illustrates superimposed lasing spectrum at different lasing wavelengths.
Figure 16:
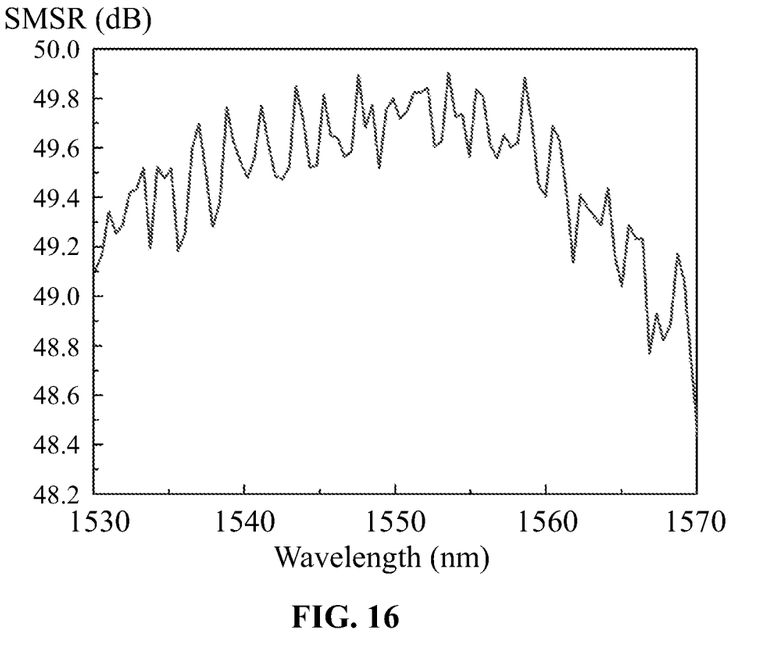
FIG. 16 illustrates SMSRs at different lasing wavelengths.
Figure 17:
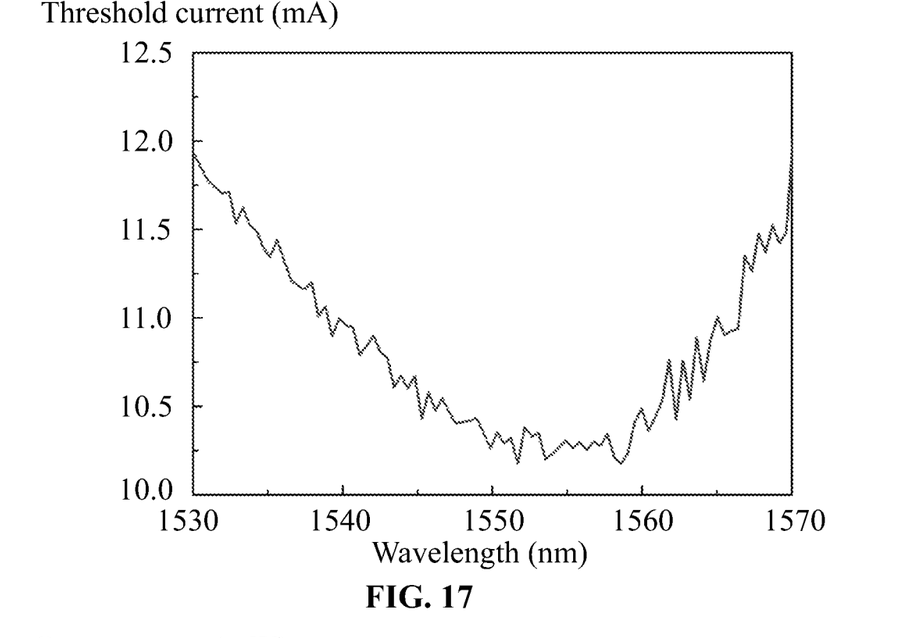
FIG. 17 illustrates threshold currents at different lasing wavelengths.

FIGS. 15-17 shows the results calculated from the steady-state multimode rate equations. The lasing spectrum at different lasing wavelengths is shown in FIG. 15, it is known from the results that the MCI laser has a very even output power across the range of 40 nm covering the whole C-band. The output power variations are in the range of 0.3 dB. FIG. 16 shows the SMSRs at different lasing wavelengths, which is up to 52.4 dB around 1550 nm. The constrains of SMSRs mainly come from the adjacent cavity modes. The laser also has very low threshold currents, which is shown in FIG. 17. The threshold currents are around 11 mA. The fluctuations seen in the curves are due to the loss induced by the currents injected into the phase sections to change phase.

Figure 18:
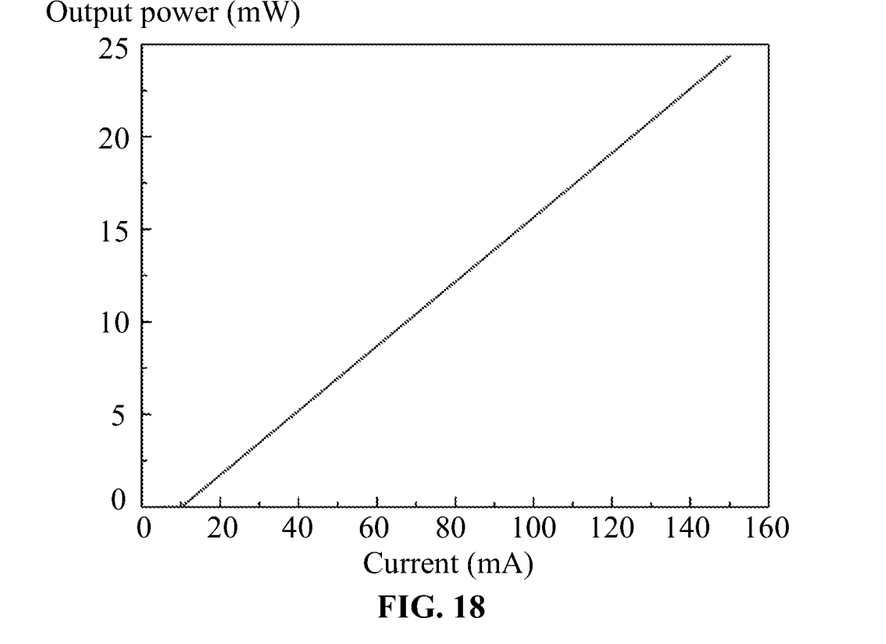
FIG. 18 illustrates an L-I curve of lasing wavelength at 1550 nm.

The calculated L-I curve at 1550 nm is presented in FIG. 18. The L-I curve is linear and the threshold current is around 11.5 mA as seen from the inset which shows the details of the L-I curve around the threshold current. The slope efficiency obtained is 0.174 mW/mA.

Unless otherwise indicated, the numerical ranges involved in the invention include the end values. While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A tunable laser, comprising:
   a) a gain section;
   b) a multi-channel splitter section; and
   c) a multi-channel reflection section, the multi-channel reflection section comprising multiple arms of unequal lengths;
   wherein
      the gain section, the multi-channel splitter section, and the multi-channel reflection section are sequentially connected in that order;
      the gain section is configured to provide an optical gain for lasing; a facet of the gain section away from the multi-channel splitter section is an optical output facet of the laser;
      the multi-channel splitter section is configured to split an input signal into multiple outputs;
      the multi-channel reflection section is configured to provide an optical feedback and a mode selection function for the laser to work; and
      when arranging the multiple arms of the multi-channel reflection section in an order according to their lengths, length difference between adjacent arms are unequal; facets of the multiple arms away from the multi-channel splitter section are coated with reflection films; arm phase sections are disposed on each of the multiple arms of unequal lengths for adjusting phases of the arms individually; and a number of the multiple arms is equal to or greater than 3.

2. The laser of claim 1, further comprising a common phase section configured to change a wavelength of a longitudinal mode of the laser and connected between the gain section and the multi-channel splitter section.

3. The laser of claim 2, wherein a reflection spectrum dominated by a single main reflection peak is generated by aggregated reflections from the multi-channel reflection section to achieve single mode working.

4. The laser of claim 3, wherein in use, the length difference between adjacent arms are determined as follows:
adjusting the length difference $\Delta L_i$ between adjacent arms according to that when an average value of the length difference $\Delta L_i$ tends to enlarge, a full width half maximum of the main reflection peak reduces thus suppression of the adjacent longitudinal modes is enhanced, while suppression of the other minor random reflection peaks is weakened, and that when the average value of the length difference $\Delta L_i$ tends to reduce, suppression of the other minor random reflection peaks is enhanced, while the full width half maximum of the main reflection peak enlarges thus weakening suppression of the adjacent longitudinal modes; and
optimizing the length difference between adjacent arms so as to suppress both the adjacent longitudinal modes and the other minor random reflection peaks to an appropriate level.

5. The laser of claim 4, wherein the lengths of the multiple arms are determined as follows:
choosing one arm as a reference arm and setting an appropriate length for the reference arm;
setting lengths of other arms according to the length difference.

6. The laser of claim 1, wherein the multi-channel splitter section adopts multi-mode interferometers, Y branches, or a star coupler.

7. The laser of claim 6, wherein a reflection spectrum dominated by a single main reflection peak is generated by aggregated reflections from the multi-channel reflection section to achieve single mode working.

8. The laser of claim 7, wherein in use, the length difference between adjacent arms are determined as follows:
adjusting the length difference $\Delta L_i$ between adjacent arms according to that when an average value of the length difference $\Delta L_i$ tends to enlarge, a full width half maximum of the main reflection peak reduces thus suppression of the adjacent longitudinal modes is enhanced, while suppression of the other minor random reflection peaks is weakened, and that when the average value of the length difference $\Delta L_i$ tends to reduce, suppression of the other minor random reflection peaks is enhanced, while the full width half maximum of the main reflection peak enlarges thus weakening suppression of the adjacent longitudinal modes; and
optimizing the length difference between adjacent arms so as to suppress both the adjacent longitudinal modes and the other minor random reflection peaks to an appropriate level.

9. The laser of claim 8, wherein the lengths of the multiple arms are determined as follows:
choosing one arm as a reference arm and setting an appropriate length for the reference arm;
setting lengths of other arms according to the length difference.

10. The laser of claim 1, wherein a reflection spectrum dominated by a single main reflection peak is generated by aggregated reflections from the multi-channel reflection section to achieve single mode working.

11. The laser of claim 10, wherein in use, the length difference between adjacent arms are determined as follows:
adjusting the length difference $\Delta L_i$ between adjacent arms according to that when an average value of the length difference $\Delta L_i$ tends to enlarge, a full width half maximum of the main reflection peak reduces thus suppression of the adjacent longitudinal modes is enhanced, while suppression of the other minor random reflection peaks is weakened, and that when the average value of the length difference $\Delta L_i$ tends to reduce, suppression of the other minor random reflection peaks is enhanced, while the full width half maximum of the main reflection peak enlarges thus weakening suppression of the adjacent longitudinal modes; and
optimizing the length difference between adjacent arms so as to suppress both the adjacent longitudinal modes and the other minor random reflection peaks to an appropriate level.

12. The laser of claim 11, wherein the lengths of the multiple arms are determined as follows:
choosing one arm as a reference arm and setting an appropriate length for the reference arm;
setting lengths of other arms according to the length difference.

13. A method of tuning using the laser of claim 1, the method comprising coarse tuning of a working wavelength of the laser, and the coarse tuning comprising:
choosing one arm as a reference arm; and
adjusting phases of other arms and enabling the phases of the other arms to be the same as a phase of the reference arm at a selected wavelength to locate a main reflection peak of a reflection spectrum at the selected wavelength and allow the laser to work in the vicinity of the selected wavelength.

14. The method of claim 13, further comprising fine tuning of the working wavelength of the laser, and the fine turning comprising:
adjusting the phase of the reference arm; and
readjusting the phases of other arms and enabling the phases of the other arms to be the same as the phase of the reference arm at the same selected wavelength to maintain a position of the main reflection peak of the reflection spectrum and align a position of the longitudinal mode position with the main reflection peak and to allow the laser to work at the wavelength selected.

15. The method of claim 14, wherein adjustments of phases of the arm phase sections and the phase of the common phase section are fulfilled by injecting currents into corresponding phase sections.

16. The method of claim 13, further comprising adjusting a phase of the common phase section to align the position of the longitudinal mode with the reflection peak at the selected wavelength to achieve fine tuning of working wavelength of the laser.

17. The method of claim 16, wherein adjustments of phases of the arm phase sections and the phase of the common phase section are fulfilled by injecting currents into corresponding phase sections.

18. The method of claim 13, wherein adjustments of phases of the arm phase sections and the phase of the common phase section are fulfilled by injecting currents into corresponding phase sections.

\* \* \* \* \*